United States Patent [19]

Onishi et al.

[11] Patent Number: 5,134,093
[45] Date of Patent: Jul. 28, 1992

[54] METHOD OF FABRICATING A SEMICONDUCTOR DEVICE INCLUDING A PROTECTIVE LAYER

[75] Inventors: Teruhito Onishi, Hirakata; Tetsuya Ueda, Moriguchi, both of Japan

[73] Assignee: Matsushita Electric Industrial Co., Ltd., Osaka, Japan

[21] Appl. No.: 642,474

[22] Filed: Jan. 17, 1991

[30] Foreign Application Priority Data

Jan. 19, 1990 [JP]  Japan .................... 2-11341

[51] Int. Cl.⁵ .................................. H01L 21/283
[52] U.S. Cl. .................................. 437/197; 437/194; 437/236; 148/DIG. 15; 148/285; 156/643
[58] Field of Search ............... 156/643; 437/189, 194, 437/197, 198, 199, 236, 237, 245, 246; 148/DIG. 15, 285

[56] References Cited

U.S. PATENT DOCUMENTS

| 3,585,461 | 6/1971 | Eynon et al. | 437/189 |
| 4,089,709 | 5/1978 | Harris | 437/236 |
| 4,351,696 | 9/1982 | Radigan | 156/643 |
| 4,412,885 | 11/1983 | Wang et al. | 156/643 |
| 4,561,168 | 12/1985 | Pitzer et al. | 437/189 |
| 4,592,800 | 6/1986 | Landau et al. | 156/643 |
| 4,997,746 | 3/1991 | Greco et al. | 437/229 |

OTHER PUBLICATIONS

Sze, S. M., VLSI Technology, 1983, McGraw-Hill, pp. 380–381.

*Primary Examiner*—T. N. Quach
*Attorney, Agent, or Firm*—Ratner & Prestia

[57] ABSTRACT

A method of fabricating a semiconductor device is disclosed, which can prevent disconnection failures due to corrosion of aluminum-base alloy lines in the semiconductor device. First, an aluminum-base alloy film containing at least one kind of alloying element other than aluminum is formed on an insulating film which covers a semiconductor substrate. Before the surface of the aluminum-base alloy film is cleaned with fuming nitric acid, the surface treatment of the aluminum-base alloy film is performed using a plasma of an oxygen-base gas, to cover fully the surface of the aluminum-base alloy film with passivation film. Next, the given portions of the aluminum-base alloy film are selectively etched to form a line pattern. The surface treatment of the line pattern is performed using a plasma of an oxygen-base gas to cover fully the sides of the line pattern with passive film, before the surface of the line pattern is cleaned with fuming nitric acid.

9 Claims, 4 Drawing Sheets

CONDITION: 130°C, 5min.

| PRESSURE / FLOW | 0.7 Torr | 0.5 Torr | 0.3 Torr |
|---|---|---|---|
| 600 sccm | 1 | 1 | 1 |
| 300 sccm | 1 | 4 | 4 |
| 100 sccm | 11 | 7 | 3 |

*Fig. 4A*

CONDITION: 0.7 Torr, 100 sccm, 5 min.

| TEMPERATURE | 60°C | 100°C | 140°C |
|---|---|---|---|
| HOLES | 36 | 1 | 0 |

*Fig. 4B*

| NOT TREATED | ABOUT 200 |
|---|---|

*Fig. 4C*

METHOD OF FABRICATING A SEMICONDUCTOR DEVICE INCLUDING A PROTECTIVE LAYER

BACKGROUND OF THE INVENTION

1. Field of the Invention

This invention relates to a method of fabricating a semiconductor device, and more particularly, to a method of fabricating a semiconductor device having aluminum-base alloy lines.

2. Description of the Prior Art

FIGS. 5A through 5D show a prior art method of fabricating a semiconductor device. As shown in FIG. 5A, an oxide film 2 is formed on a silicon substrate 1 to cover circuit elements (not shown), for example MOSFETs, formed on the silicon substrate 1. Then, as shown in FIG. 5B, an aluminum-base alloy film 3 containing a few percent of silicon and copper is deposited on the oxide film 2. After the aluminum-base alloy film 3 is deposited on the oxide film 2, a thin, uneven native oxide film (passive film) 4 is grown on the surface of the aluminum-base alloy film 3. Thereafter, the silicon substrate 1 is cleaned with fuming nitric acid, rinsed with pure water, and then dried. After that, as shown in FIG. 5C, a resist 6 defining a line pattern (wiring pattern) formed on the aluminum-base alloy film 3 using a photolithography technique, and given portions of the aluminum-base alloy film 3 are selectively dry-etched using the resist 6 as an etch-mask, to form an aluminum-base alloy line (wiring) 3a. As shown in FIG. 5D, the resist 6 remaining on the aluminum-base alloy line 3a is removed by an ashing process using an oxygen-plasma, and organic residues on the aluminum-base alloy line 3a are removed by a cleaning process using fuming nitric acid.

In the prior art method, since the thin oxide film (passive film) 4 is unevenly grown on the deposited aluminum-base alloy film 3, pinholes (corrosion holes) are formed by corrosion, during the step of cleaning the substrate 1 with fuming nitric acid, in the aluminum-base alloy film 3 at positions indicated by arrows A in FIG. 5B and arrows B in FIG. 5D.

According to the study conducted by the inventor, et al., it has been found that the corrosion holes of the aluminum-base alloy film 3 and the aluminum-base alloy line 3a are formed not during the step of immersing or dipping the substrate 1 into the fuming nitric acid but during the subsequent step of rinsing with pure water. An aluminum-base alloy film and line containing at least one kind of alloying element (e.g., silicon, copper, silicon and copper, and so on) other than aluminum can easily be subjected to corrosion during the rinsing step due to the galvanic effects between the alloying element and aluminum, which eventually leads to a disconnection failure in the aluminum-base alloy line 3a.

SUMMARY OF THE INVENTION

The method of this invention, which overcomes the above-discussed and numerous other disadvantages and deficiencies of the prior art, comprises: forming on an insulating film covering a substrate an aluminum-base alloy film containing at least one kind of alloying element other than aluminum; cleaning the surface of said aluminum-base alloy film; and performing the surface treatment of said aluminum-base alloy film using a plasma of an oxygen-base gas, prior to said cleaning step.

In a preferred embodiment, said cleaning step comprises the steps of: cleaning the surface of said aluminum-base alloy film with fuming nitric acid; and rinsing said surface of said aluminum-base alloy film with pure water.

In a preferred embodiment, said method further comprises the steps of: etching selectively given portions of said aluminum-base alloy film to form a line pattern, after said cleaning step; cleaning the surface of said line pattern; and performing surface treatment of said line pattern using a plasma of an oxygen-base gas, prior to said step of cleaning the surface of said line pattern.

In a preferred embodiment, said cleaning step comprises the steps of: cleaning the surface of said line pattern with fuming nitric acid; and rinsing said surface of said line pattern with pure water.

In a preferred embodiment, said oxygen-base gas includes nitrogen.

In a preferred embodiment, said surface treatment is performed on said substrate at a temperature within the range of 100° to 300° C.

According to the invention, a method of fabricating a semiconductor device is provided, comprising the steps of: forming on an insulating film covering a substrate an aluminum-base alloy line pattern containing at least one kind of alloying element other than aluminum; cleaning the surface of said line pattern; and performing the surface treatment of said line pattern using a plasma of an oxygen-base gas, prior to said cleaning step.

In a preferred embodiment, said cleaning step comprises the steps of: cleaning the surface of said line pattern with fuming nitric acid; and rinsing said surface of said line pattern with pure water.

In a preferred embodiment, said oxygen-base gas includes nitrogen.

In a preferred embodiment, said surface treatment is performed on said substrate at a temperature within the range of 100° to 300° C.

Thus, the present invention described herein makes possible the objective of providing a method of fabricating a semiconductor device having aluminum-base alloy lines, which can prevent corrosion of the lines caused by cleaning steps.

BRIEF DESCRIPTION OF THE DRAWINGS

This invention may be better understood and its numerous objects and advantages will become apparent to those skilled in the art by reference to the accompanying drawings as follows:

FIGS. 4A through 4C are charts which show the relationship between the processing conditions and the number of corrosion holes formed in the process steps according to a second embodiment of the invention.

DESCRIPTION OF THE PREFERRED EMBODIMENTS

Example 1

Figure 1A:
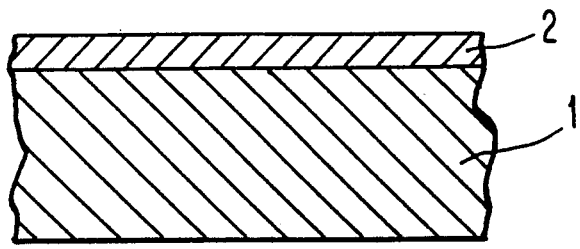
FIGS. 1A through 1E are fragmentary sectional views of device structures at various stages of the process in accordance with a first embodiment of the invention.
Figure 1B:
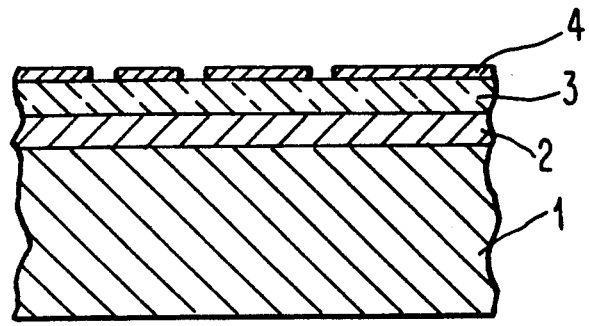

Referring to FIGS. 1A through 1E, a first embodiment of the invention will be described. First, as shown in FIG. 1A, a silicon oxide film (thickness: 700 nm) 2 is formed on a silicon substrate 1 after forming circuit elements (e.g., MOSFETs) on the silicon substrate 1. As shown in FIG. 1B, an aluminum-base alloy film (thickness: 800 nm) 3 containing a few percent of silicon and copper is deposited on the silicon oxide film 2 by using a magnetron sputtering technique. After the aluminum-base alloy film 3 is deposited, a thin, uneven native oxide film (passive film) 4 is grown on the surface of the aluminum-base alloy film 3.

Figure 1C:
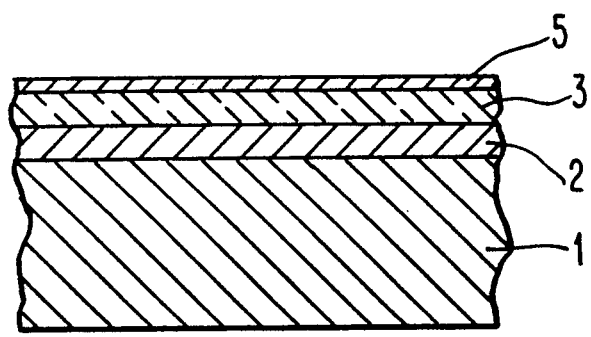

As shown in FIG. 1C, a plasma surface treatment using an oxygen-base gas as a discharge gas is performed in a downstream type of plasma equipment. The oxygen-base gas used in this embodiment is a mixed gas in which oxygen gas and N₂O gas are mixed in a ratio of 12:1. The oxygen-plasma surface treatment is performed for 100 seconds under a pressure of 532 Pa, with the substrate heated to a temperature of 200° C. The gas in which oxygen gas and N₂O gas are mixed is suitable for generating an oxygen plasma having a high ion density.

As a result of the plasma surface treatment, the uneven native passive film 4 is turned into a uniform passive film (corrosion resistant film) 5. The uniform passive film 5 covers fully the surface of the aluminum-base alloy film 3 and serves to prevent corrosion of the underling aluminum-base alloy film 3. Thereafter, the substrate 1 is immersed in a 98% nitric acid (fuming nitric acid) to remove the organic species (organic residues) adhering to the surface of the passive film 5, which is followed by a 20-minute QDR (quick dump rinsing) in a water tank. The QDR is a washing process in which pure water is allowed to overflow from the water tank for a certain period of time and then the valve on the bottom of the tank is opened to drain the water including the organic species at a burst. By repeating the QDR, a high resistivity of the pure water in the tank can be quickly recovered, and the surface of the passive film 5 can be effectively rinsed for a short time. After the QDR steps, a drying process is performed. No corrosion is caused in the aluminum-base alloy film 3 during the cleaning steps.

Figure 1D:
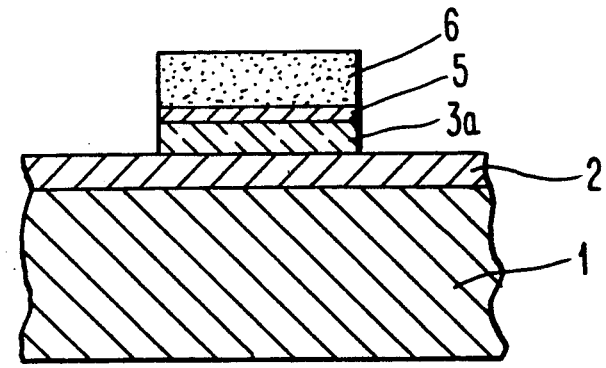
Figure 1E:
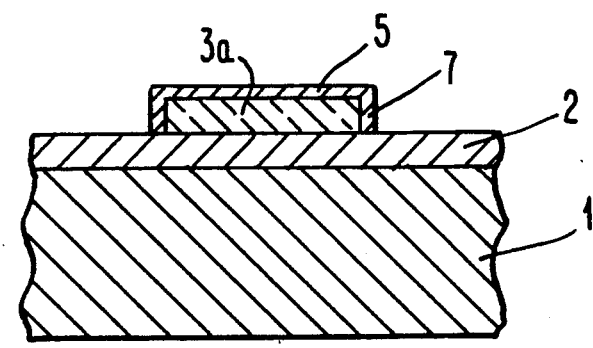

As shown in FIG. 1D, a resist 6 defining a line pattern is formed on the aluminum-base alloy film 3 by a photolithography technique, and the aluminum-base alloy film 3 is patterned in a dry-etching step using a chlorine-base gas, to form an aluminum-base alloy line 3a. The resist 6 is then removed using an oxygen-plasma ashing process. Then, the plasma surface treatment using a oxygen-base gas is performed once again in the downstream type plasma equipment under the same conditions as previously mentioned, to form a uniform passive film (corrosion resistant film) 7 on the sides of the aluminum-base alloy line 3a, as shown in FIG. 1E. After the plasma surface treatment, organic residues are removed using fuming nitric acid. No corrosion is caused in the aluminum-base alloy line 3a during or after the cleaning step.

In a fabrication process of a semiconductor device, after the line pattern 3a is formed, testing the semiconductor devices (e.g., MOSFETs) and the line pattern 3a itself is carried out using a test prober. And, observations of the surface of the substrate on which the devices and the line pattern 3a are formed, is made through an optical microscope or an SEM. The above-mentioned testing and observation steps are followed by subsequent fabrication process, for example, formation of passivation film, annealing. Just before the subsequent process, the cleaning the surface of the line pattern 3a with fuming nitric acid is performed once or more. According to the invention, before each of the cleaning steps with fuming acid, the plasma surface treatment using an oxygen-base gas is performed under the same conditions as previously mentioned, in order to effectively prevent the corrosion of the line pattern 3a.

By observations using dark-field micrographic images, the surface of the aluminum-base alloy film treated by the oxygen plasma was compared with that treated by the prior art method. No corrosion was observed on the surface of the aluminum-base alloy film of the present embodiment, whereas corrosion holes (white, bright spots in the dark-field images) are observed on the surface of aluminum-base alloy film treated by the prior art method. It can be seen that the aluminum-base alloy film can be prevented from being attacked by corrosion when complete passivation is provided by performing the plasma surface treatment using an oxygen-base gas prior to the cleaning step with fuming nitric acid.

Figure 2:
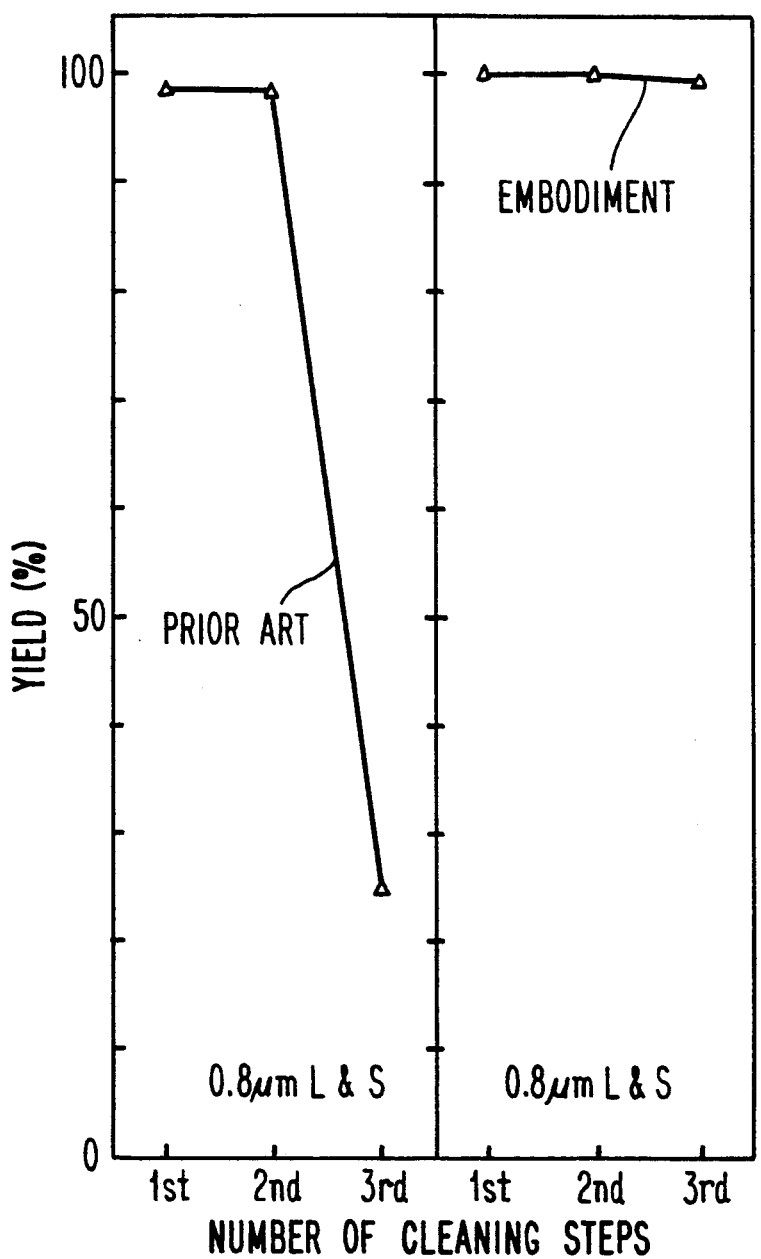
FIG. 2 is a graph showing the relationship between the yield of aluminum-base lines and the number of cleaning steps.
Figure 3:
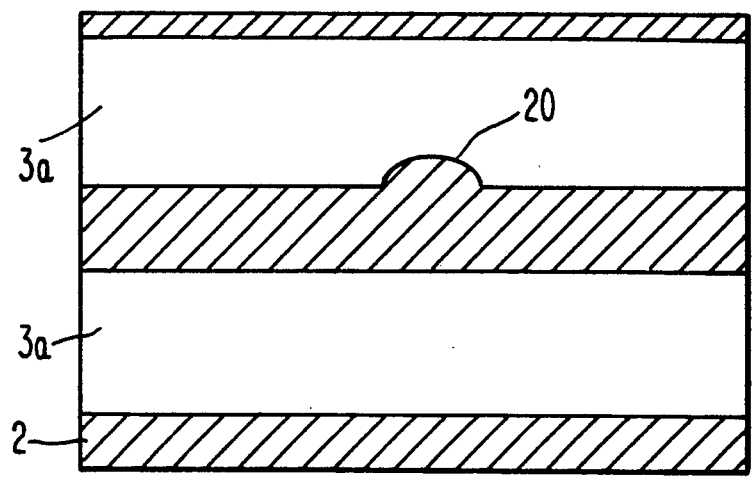
FIG. 3 is a plan view showing the surface of an aluminum-base line having a void formed therein.
Figure 5A:
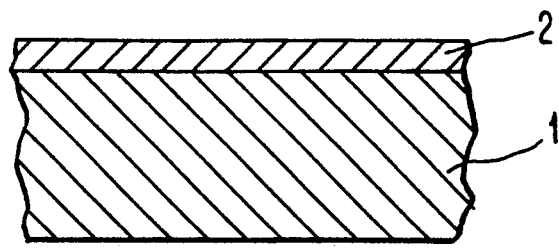
FIGS. 5A through 5D are fragmentary sectional views of device structures at various stages of the process in accordance with a prior art method.
Figure 5B:
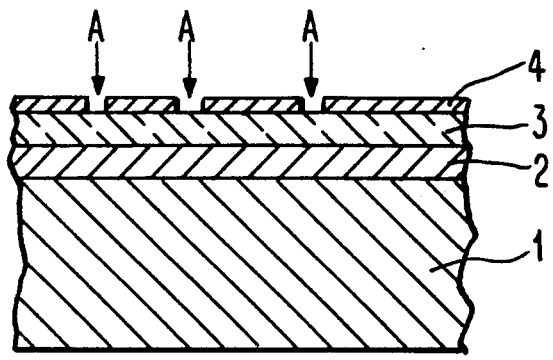
Figure 5C:
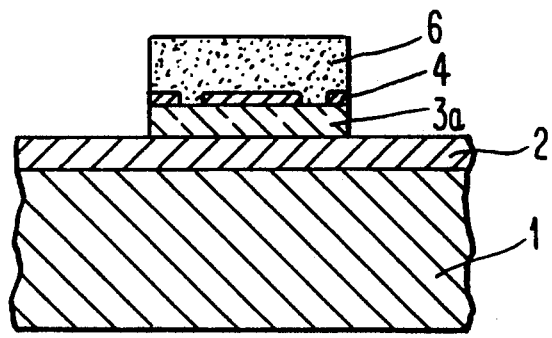
Figure 5D:
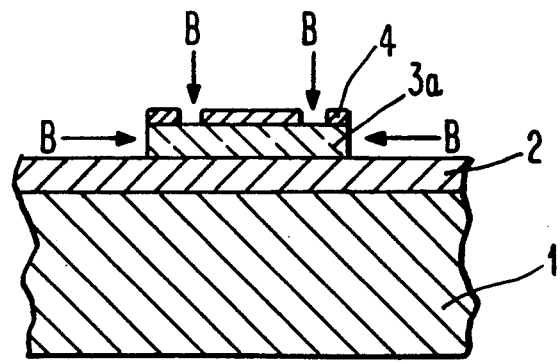

FIG. 2 is a graph in which the yield of line pattern on a silicon wafer are plotted along the ordinate and the frequency of cleaning along the abscissa. The line pattern (each line having a width of 0.8 μm and a length of 200 cm) were made of an aluminum-base alloy using a photolithography technique and a dry etching technique. To verify the effect of the oxygen-base gas plasma surface treatment, the step of "oxygen-base gas processing plus cleaning with fuming nitric acid" was repeated three times, and the results were compared with that of a wafer treated by repeating the cleaning with fuming nitric acid without performing the oxygen-base gas plasma surface treatment (the prior art process). As shown in FIG. 2, the yield is retained throughout the repeated cleaning process in the case of the wafer treated with the oxygen plasma surface treatment, whereas in the case of the prior art, the yield abruptly dropped to about 25% after the third cleaning. FIG. 3 shows a plan view, based on an SEM photograph, of an aluminum-base alloy line on a wafer not treated with the oxygen-base gas plasma. An aluminum void 20 is observed which was formed by part of the line being recessed in a V-shaped form as a result of cleaning steps with fuming nitric acid, which eventually leads to a break in the line and reduces the product yield of a semiconductor device. On the other hand, according to the method of the present embodiment, since the passive films 5 and 7 are formed uniformly, there are no aluminum voids 20 to be observed, and a high yield is attained.

As described above, according to the present embodiment, the oxygen-base gas plasma surface treatment serves to prevent aluminum voids from being formed as a result of the cleaning steps.

Example 2

Similar processes to those shown in FIG. 1 were conducted, but the discharge gas was replaced by an oxygen gas to treat the surface of the aluminum-base alloy film 3 or line 3a. The plasma surface treatment using the oxygen gas was performed for 5 minutes at a pressure of 0.3 to 0.7 Torr, with the substrate heated to a temperature of 60° to 140 ° C., while the oxygen gas flow rate was varied within the range of 100 to 600 sccm.

FIGS. 4A through 4C show the relationship between the conditions of the oxygen plasma surface treatment and the average number of corrosion holes found within an area of 360 $\mu m^2$ on the surface of the aluminum-base alloy film after the cleaning process with fuming nitric acid. The number of corrosion holes is the mean value at three areas on the wafer, and since corrosion was looked for with great care, the part with one corrosion hole can be safety regarded as having no corrosion. Resistance to corrosion increases with an increase in the substrate temperature, but there was hardly any noted dependence on the pressure or the flow rate of the discharge gas (FIGS. 4A and 4B). However, a marked difference was noted as compared with the surface not treated with the oxygen gas plasma surface treatment (FIG. 4C).

As described above, according to the embodiment, a resistance against corrosion was noted when the substrate temperature is set at 100° C. or higher. Also, if the substrate temperature was high during the plasma surface treatment, it is also possible to dispel the chlorides remaining on the substrate after the dry etching. When the plasma surface treatment is performed with the substrate heated to a temperature of 300° C. or higher, no corrosion is observed but aluminum hillocks are observed. In addition, the plasma surface treatment with the substrate at a temperature of 300° C. or higher is not practical since it alters the surface morphology of the line pattern and causes shorts to upper level lines. It is therefore desirable that the plasma surface treatment be performed with the substrate at a temperature within the range of 100° to 300° C.

While the oxygen plasma surface treatment processes are performed both before and after patterning the aluminum-base alloy film to the line in the above embodiments, it is not necessary to carry out the oxygen-plasma surface treatment processes both before and after the patterning process. If the cleaning process before or after the patterning process is not required, either of the two oxygen plasma surface treatment processes can be omitted.

In the embodiments, a downstream type plasma equipment is used, but the same effects can be obtained by using other types of plasma equipment that can produce an oxygen plasma. Also, in the embodiments, copper is used as an alloying element, but the same effects can be obtained for other alloying elements such as palladium, titanium, or a mixture of them.

As described above, according to a method of the present invention, the surfaces of the aluminum-base alloy film and line are forcibly oxidized (passivated) using a plasma of an oxygen-base gas, thereby covering the surface of the aluminum-base alloy film and line with a uniform passive film to provide resistance to corrosion.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a semiconductor device, comprising the steps of:

forming, on an insulating film covering a substrate, an aluminum-base film comprising an aluminum-base alloy containing at least one kind of alloying element other than aluminum;

forming a protective layer on a surface of said aluminum-base film by treating said surface using a plasma of an oxygen-base gas;

cleaning said treated surface of said aluminum-base film with fuming nitric acid;

rinsing said cleaned surface of said aluminum-base film with pure water; and etching selectively given portions of said aluminum-base film.

2. A method according to claim 1, wherein said oxygen-base gas contains nitrogen atoms.

3. A method according to claim 1, wherein said treating step is performed at a substrate temperature within a range of 100° C. to 300° C.

4. A method of fabricating a semiconductor device, comprising the steps of:

forming on an insulating film covering a substrate an aluminum-base line pattern comprising an aluminum-base alloy containing at least one kind of alloying element other than aluminum;

forming a protective layer on a surface of said aluminum-base line pattern by treating said patterned surface using a plasma of an oxygen-base gas;

cleaning said treated surface of said aluminum-base line pattern with fuming nitric acid; and rinsing said cleaned surface of said aluminum-base line pattern with pure water.

5. A method according to claim 4, wherein said oxygen-base gas contains nitrogen atoms.

6. A method according to claim 4, wherein said treating step is performed at a substrate temperature within a range of 100° C. to 300° C.

7. A method according to claim 4, wherein a series of said treating step, said cleaning step and said rinsing step is subsequently repeated.

8. A method according to claim 7, wherein said oxygen-base gas contains nitrogen atoms.

9. A method according to claim 7, wherein said treating step is performed at a substrate temperature within a range of 100° C. to 300° C.

* * * * *